(12) United States Patent
Sakai et al.

(10) Patent No.: US 11,532,545 B2
(45) Date of Patent: Dec. 20, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Munenori Sakai, Kanagawa (JP); Akio Sakata, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 36 days.

(21) Appl. No.: 17/195,303

(22) Filed: Mar. 8, 2021

(65) Prior Publication Data
US 2021/0305151 A1 Sep. 30, 2021

(30) Foreign Application Priority Data
Mar. 24, 2020 (JP) .............................. JP2020-052174

(51) Int. Cl.
*H01L 23/522* (2006.01)
*H01L 23/528* (2006.01)
(52) U.S. Cl.
CPC ...... *H01L 23/5223* (2013.01); *H01L 23/5226* (2013.01); *H01L 23/5286* (2013.01)
(58) Field of Classification Search
CPC ............. H01L 23/5223; H01L 23/5226; H01L 23/5286
(Continued)

(56) References Cited

U.S. PATENT DOCUMENTS 7,417,277 B2 8/2008 Ohkubo et al.
8,185,855 B2 5/2012 Kanari
(Continued)

FOREIGN PATENT DOCUMENTS

JP 2005-051037 A 2/2005
JP 2007-157892 A 6/2007
(Continued)

*Primary Examiner* — Tu-Tu V Ho
(74) *Attorney, Agent, or Firm* — Kim & Stewart LLP

(57) ABSTRACT

A semiconductor device of an embodiment includes: a plurality of power lines extending in a first direction; and a plurality of cells arrayed along the first direction and a second direction intersecting the first direction and having a cell height of an integer multiple of a distance between the power lines adjacent to each other in the second direction, the cell height being a dimension in the second direction, wherein the plurality of cells include: a functional cell that contributes to a function of the semiconductor device; and a capacitance cell including a diffusion region of a first conductivity type and a gate electrode stacked above the diffusion region, and functioning as a decoupling capacitor, the capacitance cell is configured as a multi-height cell having a cell height of two or more times the distance, the capacitance cell includes a plurality of overlapping regions that are regions of the gate electrode overlapping the diffusion region in a stacking direction, the overlapping regions being aligned in the second direction, and the plurality of overlapping regions are arranged in one continuous well of a second conductivity type different from the first conductivity type.

17 Claims, 14 Drawing Sheets

(58) Field of Classification Search
USPC .......................................................... 257/532
See application file for complete search history.

(56) References Cited

U.S. PATENT DOCUMENTS

| | | | |
|---|---|---|---|
| 8,669,605 | B2 | 3/2014 | Shimizu |
| 10,680,014 | B2* | 6/2020 | Ryu .................. H01L 27/11807 |
| 2007/0126031 | A1 | 6/2007 | Ohkubo et al. |
| 2009/0302422 | A1 | 12/2009 | Kanari |
| 2019/0198530 | A1 | 6/2019 | Hino et al. |

FOREIGN PATENT DOCUMENTS

| | | |
|---|---|---|
| JP | 2010-219256 A | 9/2010 |
| WO | 2008/120387 A1 | 10/2008 |
| WO | 2018/042986 A1 | 3/2018 |

* cited by examiner

SEMICONDUCTOR DEVICE

CROSS-REFERENCE TO RELATED APPLICATION(S)

This application is based upon and claims the benefit of priority from Japanese Patent Application No. 2020-052174, filed on Mar. 24, 2020, the entire contents of which are incorporated herein by reference.

FIELD

Embodiments described herein relate generally to a semiconductor device.

BACKGROUND

A semiconductor device may take a configuration in which a plurality of cells are arrayed in a direction in which power lines extend and a direction intersecting it. The cell dimension in the direction intersecting the power lines is referred to as a cell height, for example. In such a semiconductor device, the cell height of each cell is standardized by a method referred to as a standard cell method to be an integer multiple of the distance between adjacent power lines.

However, when capacitance cells that functions as a decoupling capacitor is incorporated in a semiconductor device using the standard cell method, the capacitance cells also need to be structured according to the standards of the standard cell method, and it is difficult to provide a large capacitance region, which is a region in which gate electrodes of the capacitance cells overlap diffusion regions.

DETAILED DESCRIPTION

A semiconductor device of the embodiment includes: a plurality of power lines extending in a first direction; and a plurality of cells arrayed along the first direction and a second direction intersecting the first direction and having a cell height of an integer multiple of a distance between the power lines adjacent to each other in the second direction, the cell height being a dimension in the second direction, wherein the plurality of cells include: a functional cell that contributes to a function of the semiconductor device; and a capacitance cell including a diffusion region of a first conductivity type and a gate electrode stacked above the diffusion region, and functioning as a decoupling capacitor, the capacitance cell is configured as a multi-height cell having a cell height of two or more times the distance, the capacitance cell includes a plurality of overlapping regions that are regions of the gate electrode overlapping the diffusion region in a stacking direction, the overlapping regions being aligned in the second direction, and the plurality of overlapping regions are arranged in one continuous well of a second conductivity type different from the first conductivity type.

The present invention will be described in detail below with reference to the drawings. Note that the present invention is not limited to the following embodiment. The components in the following embodiment include components that can be easily conceived by a person skilled in the art or substantially equivalent components.

Example Configuration of Semiconductor Device

Figure 1A:
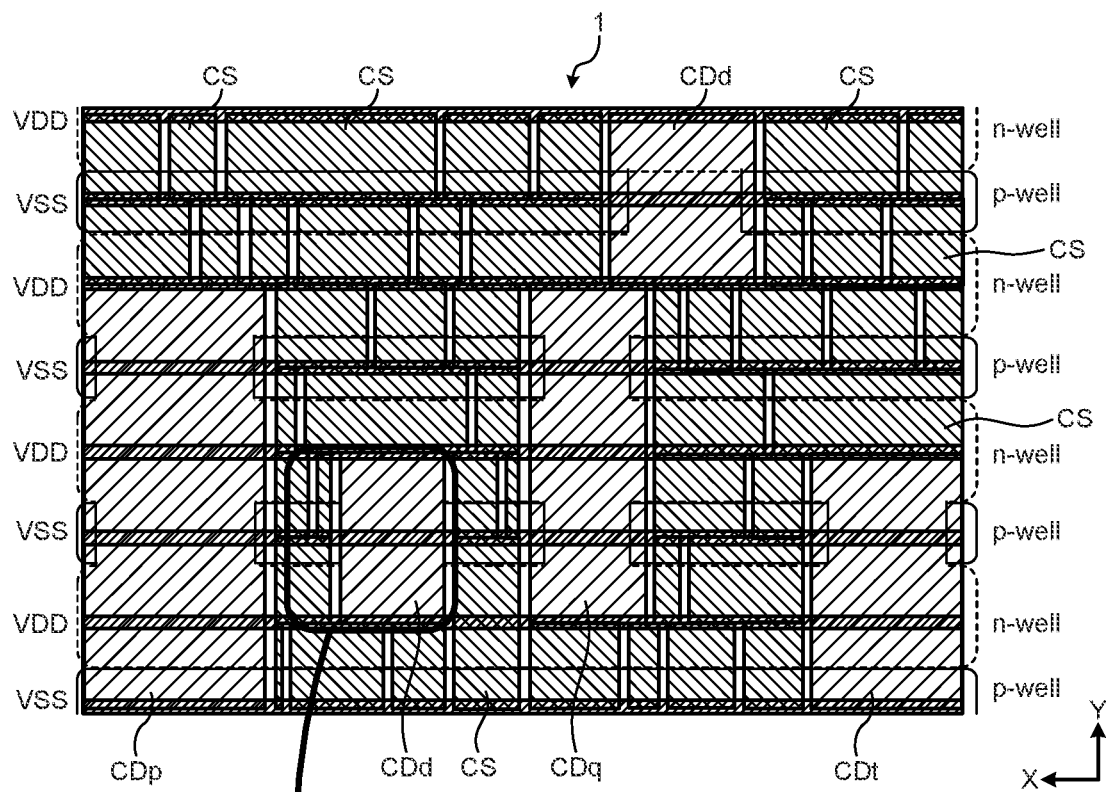
FIGS. 1A and 1B are plan views illustrating an example configuration of a semiconductor device according to an embodiment.
Figure 1B:
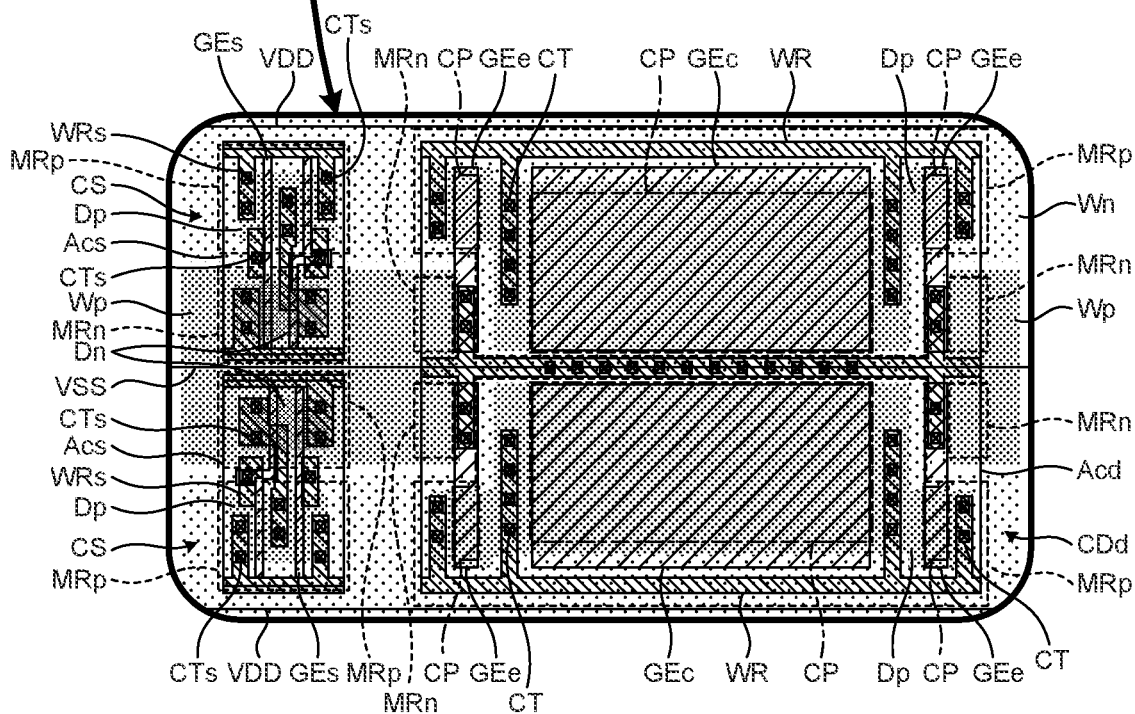

FIGS. 1A and 1B are plan views illustrating an example configuration of a semiconductor device 1 according to an embodiment. FIG. 1A illustrates the entire configuration of the semiconductor device 1, and FIG. 1B illustrates a partial enlarged view of the semiconductor device 1.

As illustrated in FIG. 1A, the semiconductor device 1 includes a plurality of power lines VDD and VSS, a plurality of functional cells CS, and a plurality of capacitance cells CD (CDd, CDt, CDq, and CDp).

The plurality of power lines VDD and VSS extend in an X direction, for example, and the power lines VDD and the power lines VSS are alternately arranged in a Y direction, which intersects the X direction. In the semiconductor device 1, the distances between the power lines VDD and VSS are designed to be equal to each other.

For example, an n-well is arranged along each power line VDD in a region in which the power line VDD and its neighboring functional cells CS are arranged. For example, a p-well is arranged along each power line VSS in a region in which the power line VSS and its neighboring functional cells CS are arranged.

The plurality of functional cells CS and the plurality of capacitance cells CD are arrayed along the X direction and the Y direction. Each functional cell CS and each capacitance cell CD have a cell height, which is a cell dimension in the Y direction, of an integer multiple of the distance between power lines VDD and VSS that are adjacent to each other.

These functional cells CS and capacitance cells CD having cell heights standardized with respect to the distance between the power lines VDD and VSS may be referred to as standard cells, and a method of configuring the semiconductor device 1 by using the standard cells may be referred to as a standard cell method.

In this specification, the above-mentioned Y direction is also referred to as a height direction of the functional cells CS and the capacitance cells CD. Assuming each distance between the power lines VDD and VSS in the Y direction as one row, the Y direction may also be referred to as a row direction. Meanwhile, in this specification, the above-mentioned X direction is also referred to as a width direction of the functional cells CS and the capacitance cells CD. The X direction may also be referred to as a column direction.

Each functional cell CS is a cell that contributes to a function of the semiconductor device 1, and has a cell height of one or more times the distance between the power lines VDD and VSS, for example. That is, the minimum cell height of the functional cells CS is designed to be equal to the distance between the power lines VDD and VSS.

Each functional cell CS includes at least one region arranged in the above-mentioned n-well and at least one region arranged in the above-mentioned p-well. Thus, for example, in the case of a single-height cell having a cell height equal to the distance between the power lines VDD and VSS, a portion of the functional cell CS closer to one end in the Y direction is arranged in the n-well, and the other end side is arranged in the p-well. Meanwhile, for example, in the case of a double-height cell having a cell height of twice the distance between the power lines VDD and VSS, both Y-direction end portions of the functional cell CS are arranged in the n-well or p-well, and its central portion is arranged in a well having the opposite conductivity type to that of both end portions.

Each capacitance cell CD is a cell that functions as a decoupling capacitor using the gate electrode capacitance of a PMOS transistor, for example, and is interposed between functional cells CS, for example, in order to suppress noise such as fluctuation of power supply during operation of the semiconductor device 1.

Each capacitance cell CD has a cell height of two or more times the distance between the power lines VDD and VSS, for example. Such a cell having a cell height of two or more times the distance between the power lines VDD and VSS is referred to as a multi-height cell. For example, the capacitance cells CDd, CDt, CDq, and CDp in FIG. 1A are multi-height cells.

Of these, the capacitance cell CDd has a cell height of twice the distance between the power lines VDD and VSS (corresponding to two rows). The capacitance cell CDt has a cell height of three times the distance between the power lines VDD and VSS (corresponding to three rows). The capacitance cell CDq has a cell height of four times the distance between the power lines VDD and VSS (corresponding to four rows). The capacitance cell CDp has a cell height of five times the distance between the power lines VDD and VSS (corresponding to five rows).

When these capacitance cells CDd, CDt, CDq, and CDp are not distinguished, they are simply referred to as capacitance cells CD.

In each capacitance cell CD, both X-direction end portions at positions straddling the power line VSS are arranged in p-wells.

In a capacitance cell CD having a cell height of an even multiple of the distance between the power lines VDD and VSS such as a capacitance cell CDd or CDq out of the capacitance cells CD having various cell heights, both end portions from one Y-direction end portion to the other end portion are arranged in one continuous n-well. Thus, in the X-direction central portion of this capacitance cell CD, the n-well continuously extends from the one Y-direction end portion of this capacitance cell to the other end portion.

In a capacitance cell CD having a cell height of an odd multiple of the distance between the power lines VDD and VSS such as a capacitance cell CDt or CDp out of the capacitance cells CD having various cell heights, one Y-direction end portion is arranged in an n-well, and the other end portion is arranged in a p-well. In the X-direction central portion of this capacitance cell CD, the n-well continuously extends from the one Y-direction end portion of this capacitance cell to a position near the other end portion arranged in the p-well.

FIG. 1B illustrates one capacitance cell CDd configured as a double-height cell and two functional cells CS arranged adjacent to this capacitance cell CDd and configured as single-height cells.

As illustrated in FIG. 1B, a cell region Acs of one functional cell CS extends from a position near one power line VSS toward one side in the Y direction, and the other Y-direction end portion of the cell region Acs reaches a position near the power line VDD adjacent to the power line VSS.

A region of the cell region Acs of the functional cell CS closer to the power line VDD in the Y direction is arranged in an n-well Wn. A p-type diffusion region Dp is arranged in the n-well Wn in which the cell region Acs is arranged. A dotted-line region enclosing the diffusion region Dp is a p$^+$-implantation region MRp. The n-well Wn needs to have a sufficient area relative to the p$^+$-implantation region MRp.

A region of the cell region Acs of the functional cell CS closer to the power line VSS in the Y direction is arranged in a p-well Wp. A n-type diffusion region Dn is arranged in the p-well Wp in which the cell region Acs is arranged. A dotted-line region enclosing the diffusion region Dn is an n$^+$-implantation region MRn. The p-well Wp needs to have a sufficient area relative to the n$^+$-implantation region MRn.

The functional cell CS includes a gate electrode GEs extending over the diffusion regions Dp and Dn. For example, the gate electrode GEs is formed of polysilicon or the like. The gate electrode GEs is arranged over the diffusion regions Dp and Dn with the intervention of a gate oxide film (not illustrated).

The functional cell CS may additionally include a contact CTs connected to the gate electrode GEs or the diffusion region Dp, Dn, or the like, a wiring layer WRs connected to the upper end portion of the contact CTs, and the like, for example.

Meanwhile, a cell region Acd of the capacitance cell CDd extends from a position near one power line VSS toward both sides in the Y direction, and each of both Y-direction end portions of the cell region Acd reaches a position near the power line VDD adjacent to the power line VSS.

Both X-direction end portions in a region including the power line VSS at the Y-direction central portion of the cell region Acd of the capacitance cell CDd are arranged in a p-well Wp. This p-well Wp includes a part of the cell regions Acs of the above-mentioned functional cells CS and a part of the cell region Acd of the capacitance cell CDd and continuously extends in the X direction.

The X-direction central portion of the cell region Acd of the capacitance cell CDd, that is, a region other than the regions arranged in the p-well Wp is arranged in one continuous n-well Wn from one Y-direction end portion to the other end portion. A region of this n-well Wn closer to the power line VDD includes a part of the cell regions Acs of the above-mentioned functional cells CS and a part of the cell region Acd of the capacitance cell CDd and continuously extends in the X direction. This n-well Wn also includes a part of a functional cell (not illustrated) adjacent to the power line VDD in the Y direction and extends toward both sides in the Y direction.

In the n-well Wn in which the cell region Acd of the capacitance cell CDd is arranged, p-type diffusion regions Dp are arranged on both Y-direction sides across the power line VSS. The diffusion regions Dp in which a part of the capacitance cell CDd is arranged and the above-mentioned diffusion region Dp in which a part of the functional cell CS is arranged are not shared.

Note that a dotted-line region enclosing the diffusion region Dp of the capacitance cell CDd is a p$^+$-implantation region MRp. A region enclosed by a dotted line in a p-well Wp is an n$^+$-implantation region MRn. The n-well Wn and the p-well Wp needs to have a sufficient area relative to these p$^+$-implantation region MRp and n$^+$-implantation region MRn, respectively.

The capacitance cell CDd includes gate electrodes GEc at the X-direction central portion of the cell region Acd and on both Y-direction sides across the power line VSS. For example, the gate electrodes GEc are formed of polysilicon or the like. One end portion of each gate electrode GEc is located near the power line VSS, and the other end portion reaches a position near the power line VDD on either side of the power line VSS. In this manner, the gate electrode GEc is arranged at a position substantially overlapping the diffusion region Dp over the diffusion region Dp with the intervention of a gate oxide film (not illustrated).

The capacitance cell CDd includes gate electrodes GEe near both X-direction end portions of the cell region Acd and on both Y-direction sides across the power line VSS. For example, the gate electrodes GEe are formed of polysilicon or the like. One end portion of each gate electrode GEe is located near the power line VSS, and the other end portion reaches a position near the power line VDD on either side of the power line VSS. Thus, the gate electrode GEe is arranged over the n-well Wn and the p-well Wp. In this manner, a portion of the gate electrode GEe closer to the power line VDD is arranged at a position overlapping the diffusion region Dp over the diffusion region Dp with the intervention of a gate oxide film (not illustrated).

Regions of these gate electrodes GEc and GEe overlapping the diffusion regions Dp in the stacking direction of the gate electrodes GEc and GEe (region enclosed by long dashed short dashed lines) are capacitance regions CP of the capacitance cell CDd functioning as a decoupling capacitor. As the capacitance regions CP as overlapping regions of the diffusion regions Dp and the gate electrodes GEc and GEe have a larger area, the function of the capacitance cell CDd as a decoupling capacitor is enhanced, and the effect of suppressing noise such as fluctuation of power supply is enhanced.

In addition to the above-mentioned components, the capacitance cell CDd may also include a contact CT connected to the gate electrode GEe or the diffusion region Dp, or the like, a wiring layer WR connected to the upper end portion of the contact CT, and the like, for example.

Figure 2:
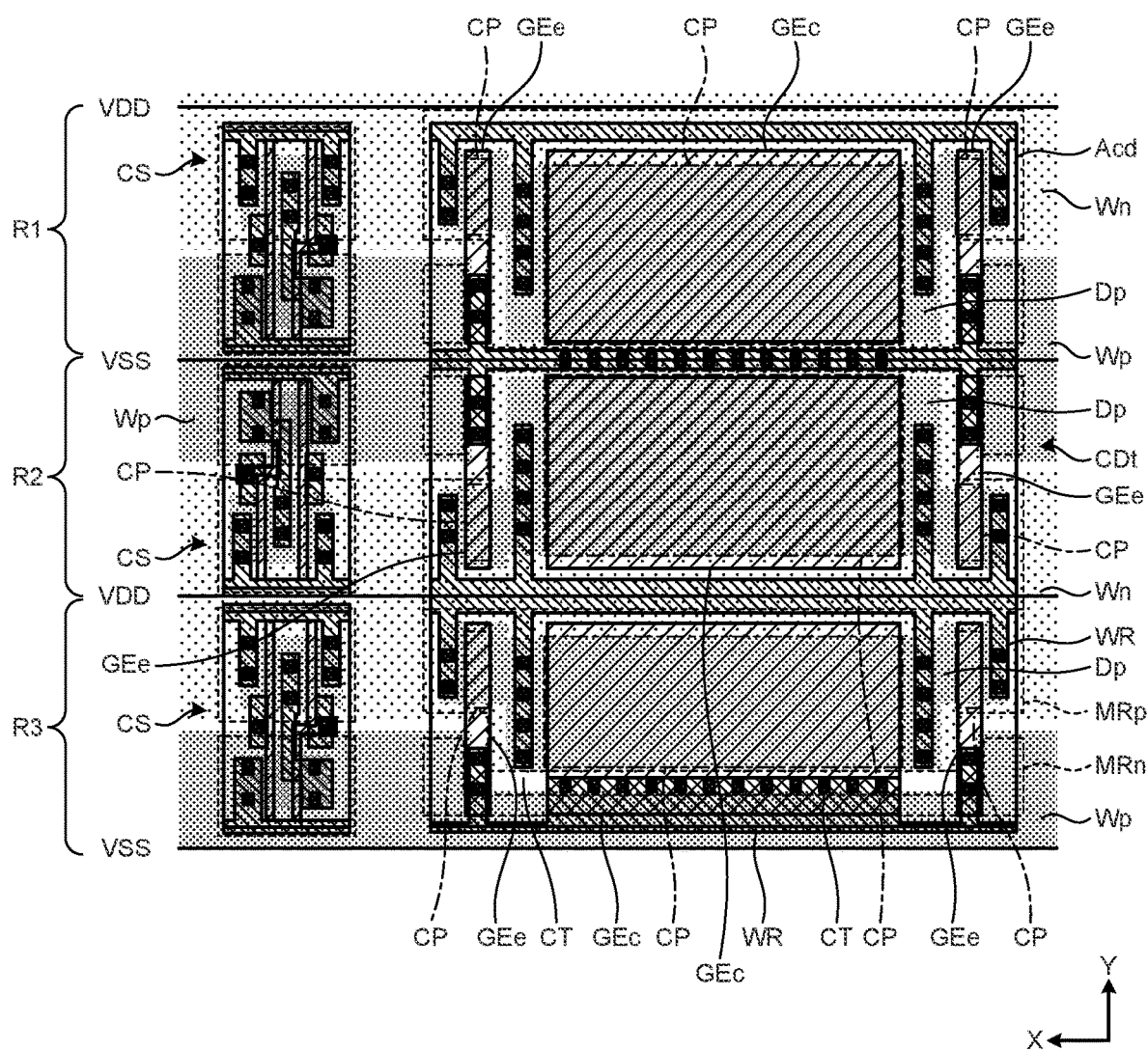
FIG. 2 is a plan view illustrating an example configuration of a capacitance cell according to the embodiment.

Here, FIG. 2 illustrates a configuration of a capacitance cell CD having a cell height of an odd multiple of the distance between the power lines VDD and VSS.

FIG. 2 is a plan view illustrating an example configuration of a capacitance cell CD according to the embodiment. More specifically, FIG. 2 illustrates one capacitance cell CDt configured as a triple-height cell having a cell height of three times the distance between the power lines VDD and VSS and three functional cells CS arranged adjacent to this capacitance cell CDt and configured as single-height cells.

As illustrated in FIG. 2, the cell region Acd of the capacitance cell CDt extends in the Y direction from a position near one power line VDD at which one end portion thereof is arranged, passes through an adjacent power line VSS and a power line VDD adjacent to the power line VSS, and reaches a position near a power line VSS beyond these power lines VSS and VDD.

Note that, in the above-described cell region Acd, a region between the power line VDD near the one end portion of the capacitance cell CDt and its adjacent power line VSS, a region between this power line VSS and the power line DD adjacent to it on the other Y-direction side, and a region between this power line VDD and the power line VSS near the other end portion of the capacitance cell CDt are referred to as rows R1, R2, and R3, respectively.

In the above-described configuration, a region of the cell region Acd of the capacitance cell CDt closer to the power line VSS located near the other Y-direction end portion of the cell region Acd is arranged in a p-well Wp. Both X-direction end portions in a region including the power line VSS located at the Y-direction central portion of the cell region Acd are arranged in a p-well Wp.

The cell region Acd of the capacitance cell CDt other than these regions is arranged in an n-well Wn. Thus, in the X-direction central portion of the cell region Acd, the region between the power line VDD near the one end portion of the capacitance cell CDt and its adjacent power line VSS (row R1), the region between this power line VSS and the power line DD adjacent to it on the other side in the Y direction (row R2), and a part of the region between this power line VDD and the power line VSS near the other end portion of the capacitance cell CDt (row 3) are arranged in one continuous n-well Wn.

In this n-well Wn, p-type diffusion regions Dp aligned in the Y direction are arranged in respective portions between the power lines VDD and VSS. A plurality of gate electrodes GEc and GEe are arranged over the diffusion regions Dp with the intervention of a gate oxide film (not illustrated), and capacitance regions CP are provided at positions overlapping the diffusion regions Dp in the stacking direction.

More specifically, in the row R1, the capacitance cell CDt has the same configuration as the region of the above-mentioned capacitance cell CDd on one side of the power line VSS.

In the row R2, the capacitance cell CDt has substantially the same configuration as the region of the above-mentioned capacitance cell CDd on one side of the power line VSS. However, in the row R2 at the Y-direction central portion of the cell region Acd of the capacitance cell CDt, unlike the above-mentioned capacitance cell CDd in which a certain distance is needed from the components of a functional cell (not illustrated) adjacent to it in the Y direction such as a diffusion region and a gate electrode, the Y-direction dimensions of the diffusion region Dp and the gate electrode GEc can be elongated and the area of the capacitance region CP as their overlapping region can be increased.

In the row R3, a portion of the capacitance cell CDt closer to the power line VDD in the Y direction is arranged in the n-well Wn extending from the row R2. A partial region of this n-well Wn closer to the power line VDD includes a part of the cell region Acs of the functional cell CS adjacent to the capacitance cell CDt and a part of the capacitance cell CDt in the row R3 and continuously extends in the X direction.

In the row R3, a p-type diffusion region Dp is arranged in the n-well Wn in which the capacitance cell CDt is arranged. The diffusion region Dp in which a part of the capacitance cell CDt in the row R3 is arranged and the diffusion region Dp in which a part of the functional cell CS adjacent to it is arranged are not shared.

In the row R3, a portion of the capacitance cell CDt closer to the power line VSS in the Y direction is arranged in a p-well Wp. This p-well Wp includes a part of the cell region Acs of the functional cell CS adjacent to the capacitance cell CDt and a part of the capacitance cell CDt in the row R3 and continuously extends in the X direction. This p-well Wp also includes a part of a functional cell (not illustrated) adjacent to the row R3 in the Y direction and extends in the Y direction.

Note that a dotted-line region enclosing the diffusion region Dp is a $p^+$-implantation region MRp. A region enclosed by a dotted line in a p-well Wp is an $n^+$-implantation region MRn. The n-well Wn and the p-well Wp needs to have a sufficient area relative to these $p^+$-implantation region MRp and $n^+$-implantation region MRn, respectively.

In the row R3, the capacitance cell CDt includes a gate electrode GEc at the X-direction central portion. For example, the gate electrodes GEc are formed of polysilicon or the like. One end portion of the gate electrode GEc is located near the power line VDD, and the other end portion reaches a position near the power line VSS. Thus, the gate electrode GEc of the capacitance cell CDt in the row R3 is arranged over the n-well Wn and the p-well Wp. In this manner, the gate electrode GEc is arranged at a position substantially overlapping the diffusion region Dp over the diffusion region Dp with the intervention of a gate oxide film (not illustrated).

In the row R3, the capacitance cell CDt includes gate electrodes GEe near both X-direction end portions. For example, the gate electrodes GEe are formed of polysilicon or the like. One end portion of each gate electrode GEe is located near the power line VDD, and the other end portion reaches a position near the power line VSS. Thus, the gate electrode GEe of the capacitance cell CDt in the row R3 is arranged over the n-well Wn and the p-well Wp. In this manner, a portion of the gate electrode GEe closer to the power line VDD is arranged at a position overlapping the diffusion region Dp over the diffusion region Dp with the intervention of a gate oxide film (not illustrated).

Regions of these gate electrodes GEc and GEe overlapping the diffusion regions Dp in the stacking direction of the gate electrodes GEc and GEe (region enclosed by long dashed short dashed lines) are capacitance regions CP of the capacitance cell CDd functioning as a decoupling capacitor.

Note that even in the row 3 at the other end portion of the capacitance cell CDt, a certain distance is needed from the components such as a gate electrode of a functional cell (not illustrated) adjacent to it in the Y direction, and thus the Y-direction dimension of the gate electrode GEc is smaller than the gate electrode GEc in the row R2 and is approximately the same as the gate electrode GEc in the row R11.

In addition, in the row R3 having the p-well Wp at its Y-direction end portion, the Y-direction dimension of the diffusion region Dp is smaller than that of the diffusion regions Dp in the rows R1 and R2, and the area of the capacitance region CP as an overlapping region of the gate electrode GEc and the diffusion region Dp is smaller than the area of the capacitance regions CP in the rows R1 and R2.

In the row R3, in addition to the above-mentioned components, the capacitance cell CDt may also include a contact CT connected to the gate electrode GEe or the diffusion region Dp, or the like, a wiring layer WR connected to the upper end portion of the contact CT, and the like, for example.

Method of Manufacturing Semiconductor Device

Figure 3:
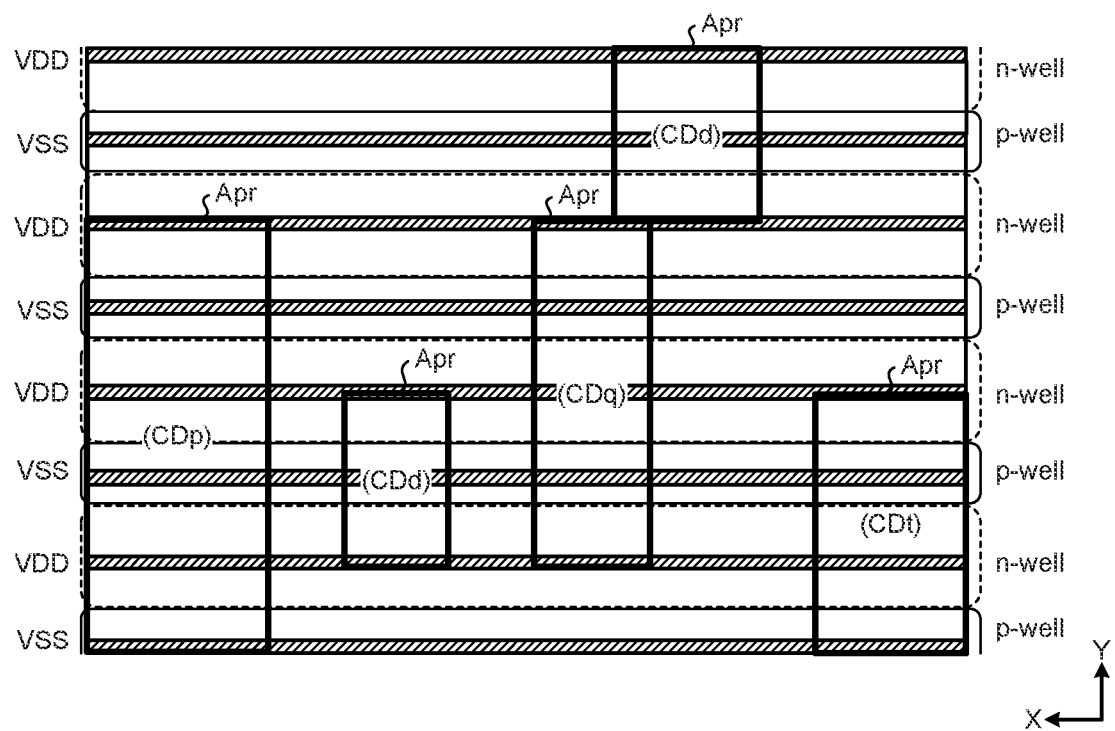
FIG. 3 is a schematic view illustrating an example cell layout of the semiconductor device according to the embodiment.

Next, a method of manufacturing the semiconductor device 1 of the embodiment will be described using FIGS. 3 to 10. FIG. 3 is a schematic view illustrating an example cell layout of the semiconductor device 1 according to the embodiment.

In manufacturing the semiconductor device 1 of the embodiment, a capacitance required for suppressing noise is estimated based on the specifications of functional cells CS provided to the semiconductor device 1 or the like. The number of capacitance cells CD to be incorporated in the semiconductor device 1, the cell heights of the individual capacitance cells CD, and other specifications are determined based on this estimated value.

FIG. 3 is an example layout of capacitance cells CD determined to incorporate the required capacitance cells CD in the semiconductor device 1. Bold frames in FIG. 3 indicate regions Apr in which capacitance cells CD are expected to be arranged. In the example of FIG. 3, it is determined that two capacitance cells CDd, one capacitance cell CDt, one capacitance cell CDq, and one capacitance cell CDp are to be incorporated in the semiconductor device 1. The capacitance cells CDd, CDt, CDq, and CDp have respective different cell widths (X-direction dimensions).

Figure 4:
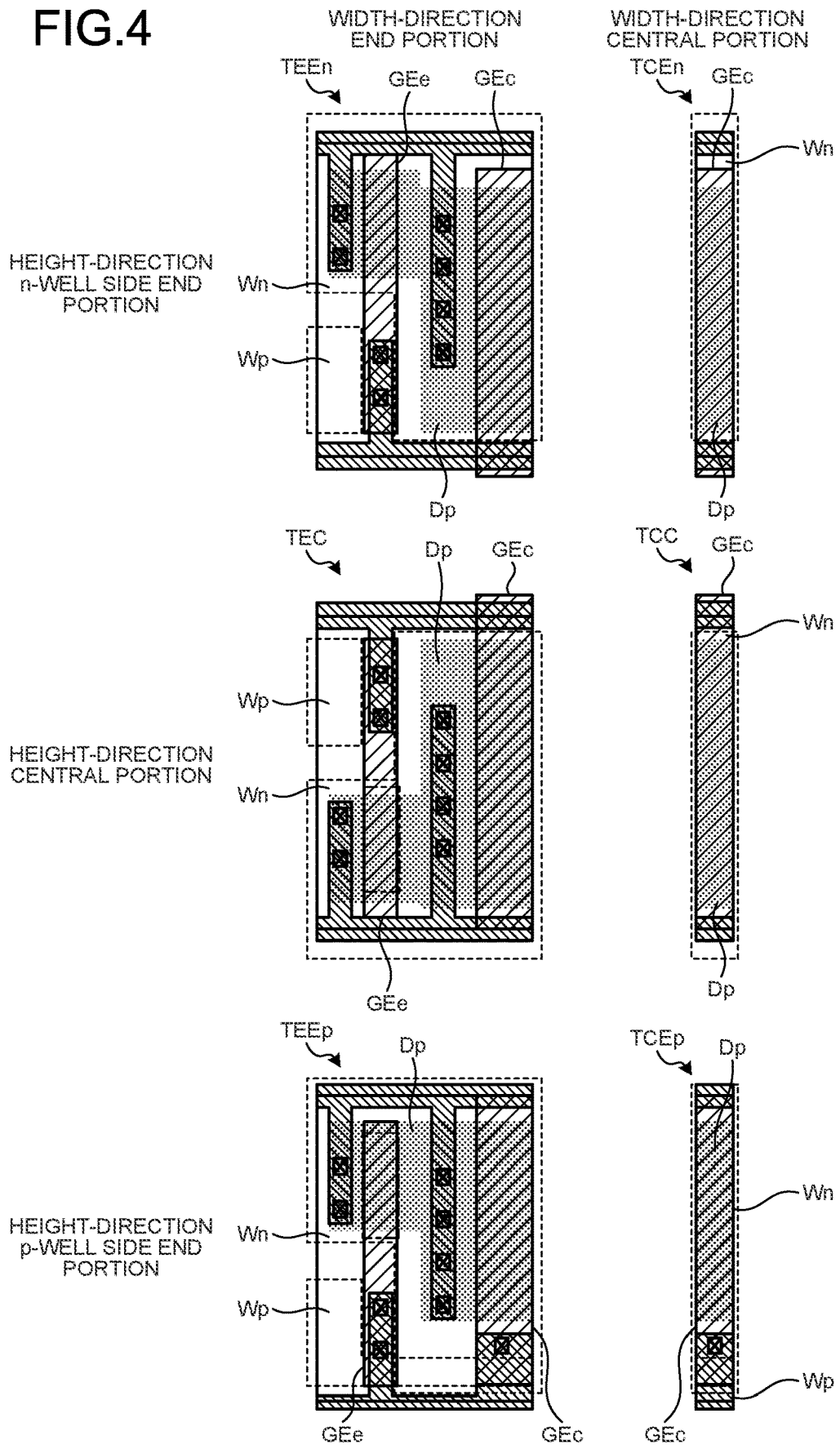
FIG. 4 is a schematic view illustrating example templates used for designing capacitance cells according to the embodiment.

These capacitance cells CDd, CDt, CDq, and CDp having various sizes and configurations are designed by combining a plurality of types of templates, for example. FIG. 4 illustrates an example of such templates.

FIG. 4 is a schematic view illustrating example templates TEEn, TEC, TEEp, TCEn, TCC, and TCEp used for designing capacitance cells CD according to the embodiment. The capacitance cells CD can be designed by appropriately performing, on these templates TEEn, TEC, TEEp, TCEn, TCC, and TCEp, rotating operations in template planes and mirror-inverting operations about an axis of the Y direction or the X direction.

As illustrated in FIG. 4, the templates TEEn, TEC, and TEEp out of the templates TEEn, TEC, TEEp, TCEn, TCC, and TCEp are templates to be arranged at an end portion of a capacitance cell CD in the width direction (X direction).

The template TEEn out of the templates TEEn, TEC, and TEEp is a template to be arranged at an end portion of a capacitance cell CD on the n-well Wn side in the height direction (Y direction). The template TEC is a template to be arranged at the central portion of a capacitance cell CD in the height direction. The template TEEp is a template to be arranged at an end portion of a capacitance cell CD on the p-well Wp side in the height direction.

The template TEEn is designed such that a p-well Wp is provided at a corner of a side opposite to the side at an end portion of the capacitance cell CD out of two sides of the rectangle facing in the height direction, and an n-well Wn is provided in other regions. An end portion of the diffusion region Dp divided in the width direction is designed in the n-well Wn.

An end portion of the gate electrode GEc divided in the width direction is designed on the diffusion region Dp of the template TEEn. One of both height-direction end portions of the gate electrode GEc that faces toward the inside of the capacitance cell CD in the height direction as described later is designed to protrude to some extent from one side of the rectangular template TEEn. In the template TEEn, a gate electrode GEe is designed over a p-well Wp and an n-well Wn.

A contact, a wiring layer, and the like may be further designed in the template TEEn.

The template TEC is designed such that a p-well Wp is provided at a corner of the rectangle and an n-well Wn is provided in other regions. An end portion of the diffusion region Dp divided in the width direction is designed in the n-well Wn.

An end portion of the gate electrode GEc divided in the width direction is designed on the diffusion region Dp of the template TEC. One of both height-direction end portions of the gate electrode GEc on the side where the p-well Wp is arranged is designed to protrude to some extent from one side of the rectangular template TEC. In the template TEC, a gate electrode GEe is designed over a p-well Wp and an n-well Wn.

A contact, a wiring layer, and the like may be further designed in the template TEC.

The template TEEp is designed such that an L-shaped p-well Wp is provided in a region including a side at an end portion of the capacitance cell CD out of two sides of the rectangle facing in the height direction, and an n-well Wn is provided in other regions. An end portion of the diffusion region Dp divided in the width direction is designed in the n-well Wn.

An end portion of the gate electrode GEc divided in the width direction is designed on the diffusion region Dp of the template TEEp. In the template TEEp, a gate electrode GEe is designed over a p-well Wp and an n-well Wn.

A contact, a wiring layer, and the like may be further designed in the template TEEp.

Meanwhile, the remaining templates TCEn, TCC, and TCEp out of the templates TEEn, TEC, TEEp, TCEn, TCC, and TCEp are templates to be arranged at the width-direction central portion of a capacitance cell CD.

The template TCEn out of these templates TCEn, TCC, and TCEp is a template to be arranged at an end portion of a capacitance cell CD on the n-well Wn side in the height direction. The template TCC is a template to be arranged at the central portion of a capacitance cell CD in the height direction. The template TCEp is a template to be arranged at an end portion of a capacitance cell CD on the p-well Wp side in the height direction.

The template TCEn has a strip-shape having a width-direction dimension smaller than that of the templates TEEn, TEC, TEEp, and the like, and is designed such that its entirety is in the n-well Wn. A part of the diffusion region Dp divided in the width direction is designed in a region of the n-well Wn excluding both end portions of the template TCEn.

A part of the gate electrode GEc divided in the width direction is designed in a region overlapping the diffusion region Dp of the template TCEn and extending beyond the diffusion region Dp toward both height-direction sides. One of both height-direction end portions of the gate electrode GEc that faces toward the inside of the capacitance cell CD in the height direction as described later is designed to protrude to some extent from one side of the strip-shaped template TCEn. The height-direction length of the gate electrode GEc included in the template TCEn is designed to be equal to the height-direction length of the gate electrode GEc included in the template TEEn.

A wiring layer and the like may be further designed in the template TCEn.

The template TCC has a strip-shape having a small width-direction dimension as in the template TCEn, and is designed such that its entirety is in the n-well Wn. A part of the diffusion region Dp divided in the width direction is designed in a region of the n-well Wn excluding both end portions of the template TCC.

A part of the gate electrode GEc divided in the width direction is designed in a region overlapping the diffusion region Dp of the template TCC and extending beyond the diffusion region Dp toward both height-direction sides. One height-direction end portion of the gate electrode GEc is arranged is designed to protrude to some extent from one side of the strip-shaped template TCC. The height-direction length of the gate electrode GEc included in the template TCC is designed to be equal to the height-direction length of the gate electrode GEc included in the template TEC. Each gate electrode GEc protrudes on the same side.

A wiring layer and the like may be further designed in the template TCC.

The template TCEp has a strip-shape having a small width-direction dimension as in the templates TCEn and TCC, and is designed such that a p-well Wp is provided at one height-direction end portion and an n-well Wn is provided in other regions. A part of the diffusion region Dp divided in the width direction is designed in the n-well Wn.

A part of the gate electrode GEc divided in the width direction is designed in a region overlapping the diffusion region Dp of the template TCEp and extending beyond the diffusion region Dp toward both height-direction sides. The height-direction length of the gate electrode GEc included in the template TCEp is designed to be equal to the height-direction length of the gate electrode GEc included in the template TEEp.

A contact, a wiring layer, and the like may be further designed in the template TCEn.

Figure 5:
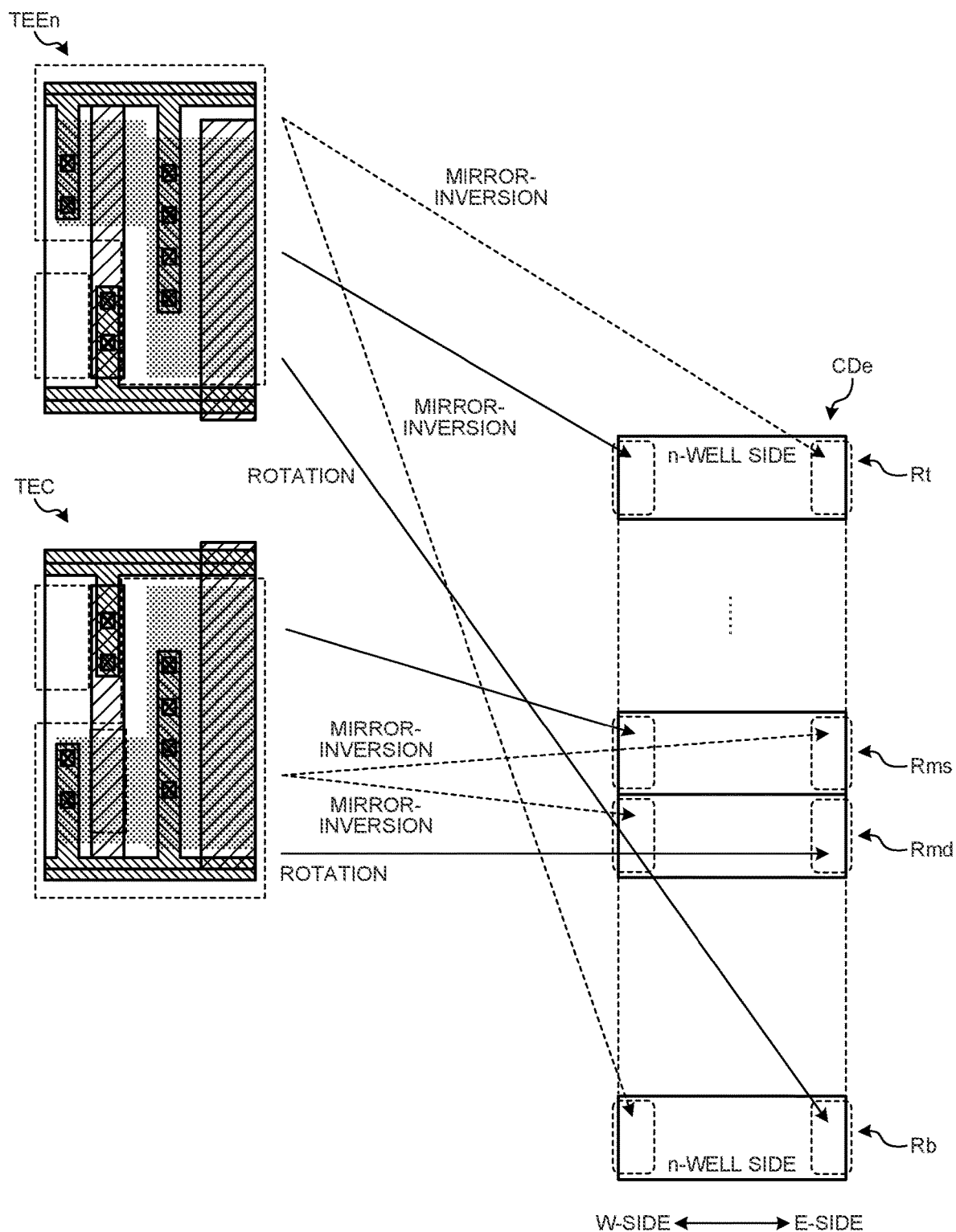
FIG. 5 is a schematic view illustrating the details of arrangement of templates in a capacitance cell according to the embodiment.

FIG. 5 is a schematic view illustrating the details of arrangement of templates TEEn and TEC in a capacitance cell CD according to the embodiment.

FIG. 5 illustrates a case where these templates TEEn and TEC are arranged in a capacitance cell CDe having rows Rt to Rms, Rmd to Rb. The capacitance cell CDe is a capacitance cell CD having a cell height of an even multiple of the distance between the power lines VDD and VSS.

Each of the rows Rt to Rms, Rmd to Rb indicates a region between power lines VDD and VSS, and the row Rt is on one end side of the capacitance cell CDe and the row Rb is the other end side. The rows Rms and Rmd are regions between power lines VDD and VSS adjacent to each other at certain positions between the rows Rt to Rb.

In the example of FIG. 5, both of an end portion of the row Rt on a height-direction side and an end portion of the row Rb on a height-direction side are n-well-side end portions. When the row Rt side is viewed from the row Rb side, the end portion of the capacitance cell CDe on the right-hand side is referred to as an E-side end portion, and the left-hand side end portion is referred to as a W-side end portion.

As illustrated in FIG. 5, the template TEEn can be arranged at the W-side end portion of the row Rt of the capacitance cell CDe. The template TEEn can be arranged at the E-side end portion of the row Rb by rotating the orientation illustrated in FIG. 5 by 180°. The template TEEn can be arranged at the E-side end portion of the row Rt and the W-side end portion of the row Rb by mirror-inversion about an axis of the Y direction, for example.

The template TEC can be arranged at the W-side end portion of the row Rms of the capacitance cell CDe located at the inner side in the height direction. The template TEC can be arranged at the E-side end portion of the row Rmd by rotating the orientation illustrated in FIG. 5 by 180°. The template TEC can be arranged at the E-side end portion of the row Rms and the W-side end portion of the row Rmd by mirror-inversion about an axis of the Y direction, for example.

Figure 6:
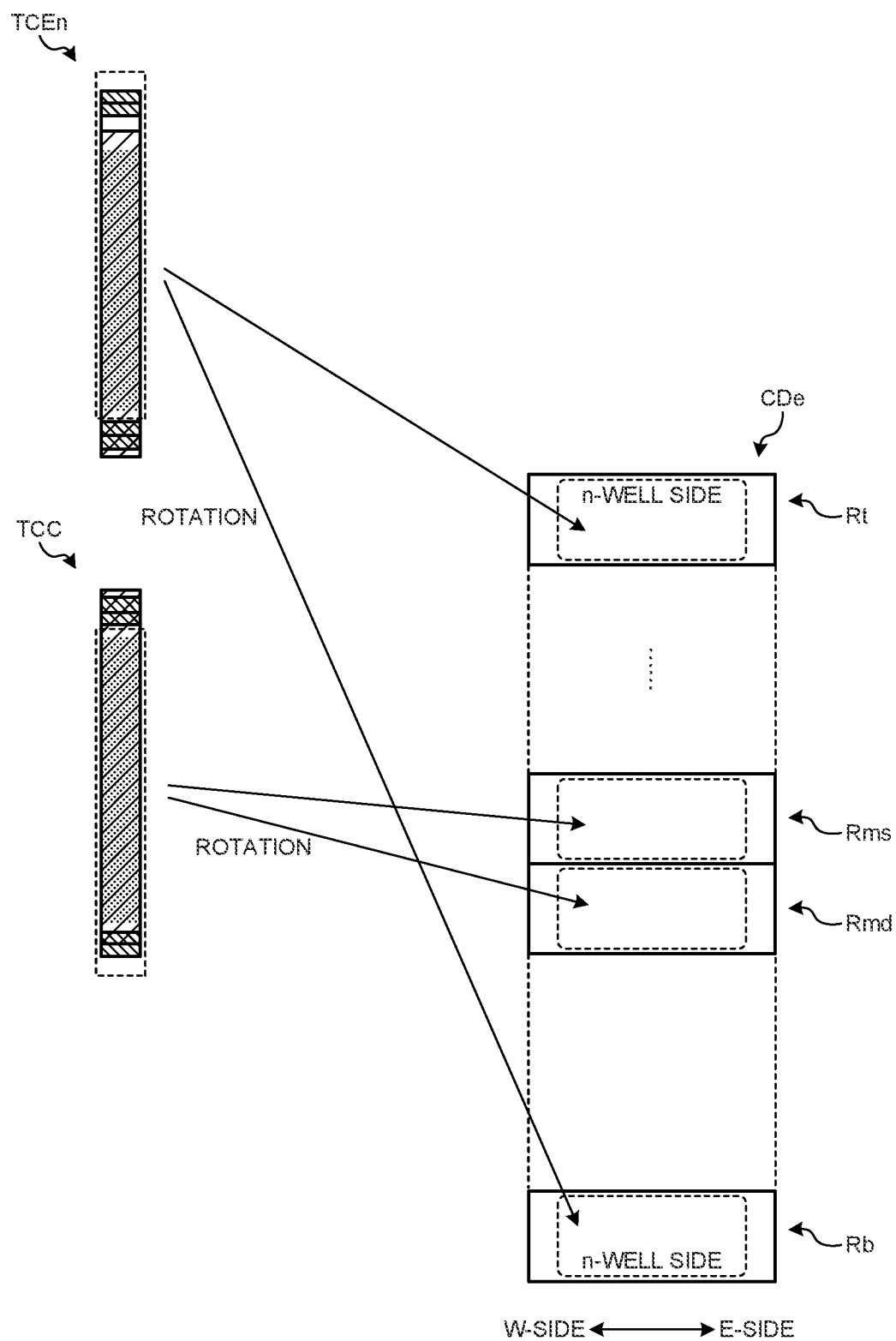
FIG. 6 is a schematic view illustrating the details of arrangement of templates in a capacitance cell according to the embodiment.

FIG. 6 is a schematic view illustrating the details of arrangement of templates TCEn and TCC in a capacitance cell CD according to the embodiment.

FIG. 6 illustrates a case where these templates TCEn and TCC are arranged in a capacitance cell CDe having rows Rt to Rms, Rmd to Rb as in the above-described example illustrated in FIG. 5.

As illustrated in FIG. 6, the template TCEn can be arranged at the width-direction central region of the row Rt of the capacitance cell CDe. Note that the width-direction central region of rows Rt to Rms, Rmd to Rb is a region in which the above-mentioned templates TEEn and TEC are not arranged. The template TCEn can be arranged at the width-direction central region of the row Rb of the capacitance cell CDe by rotating the orientation in FIG. 6 by 180°.

The template TCC can be arranged at the width-direction central region of the row Rms of the capacitance cell CDe. The template TCC can be arranged at the width-direction central region of the row Rmd of the capacitance cell CDe by rotating the orientation in FIG. 6 by 180°.

The capacitance cell CDe can be assembled and designed by performing the above-described operations of FIGS. 5 and 6.

Figure 7:
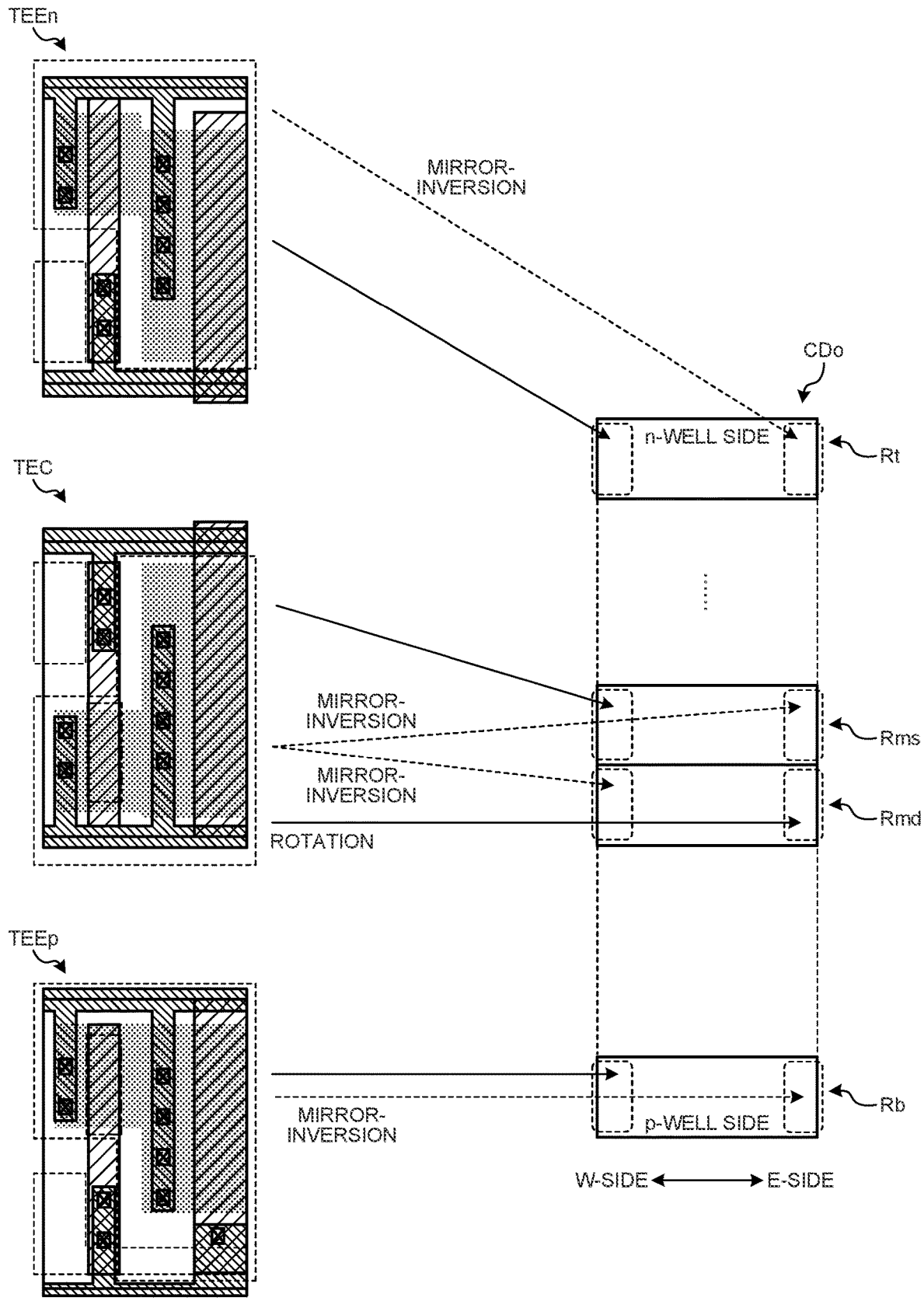
FIG. 7 is a schematic view illustrating the details of arrangement of templates in a capacitance cell according to the embodiment.

FIG. 7 is a schematic view illustrating the details of arrangement of templates TEEn, TEC, and TEEp in a capacitance cell CD according to the embodiment.

FIG. 7 illustrates a case where these templates TEEn, TEC, and TEEp are arranged in a capacitance cell CDo having rows Rt to Rms, Rmd to Rb. The capacitance cell CDo is a capacitance cell CD having a cell height of an odd multiple of the distance between the power lines VDD and VSS. In the example of FIG. 7, an end portion of the row Rb on a height-direction side is a p-well-side end portion.

As illustrated in FIG. 7, the template TEEn can be arranged at the E-side end portion and the W-side end portion of the row Rt of the capacitance cell CDo. The template TEC can be arranged at the E-side end portion and the W-side end portion of the row Rms of the capacitance cell CDo and can be arranged at the E-side end portion and the W-side end portion of the row Rmd. This is as described above for FIG. 5.

The template TEEp can be arranged at the W-side end portion of the row Rb of the capacitance cell CDo. The template TEEp can be arranged at the E-side end portion of the row Rb by mirror-inversion about an axis of the Y direction, for example.

Figure 8:
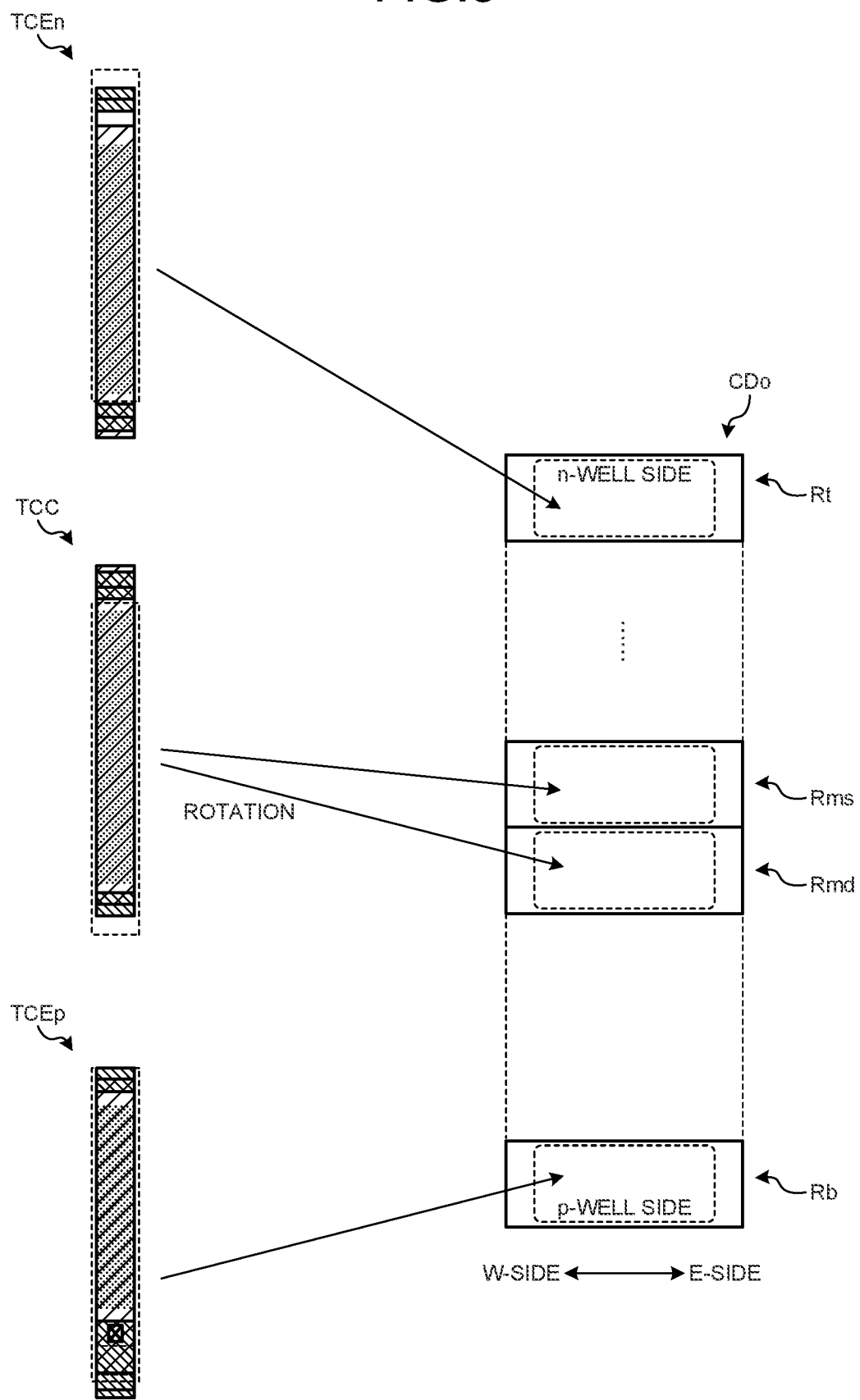
FIG. 8 is a schematic view illustrating the details of arrangement of templates in a capacitance cell according to the embodiment.

FIG. 8 is a schematic view illustrating the details of arrangement of templates TCEn, TCC, and TCEp in a capacitance cell CD according to the embodiment.

FIG. 8 illustrates a case where these templates TCEn, TCC, and TCEp are arranged in a capacitance cell CDo having rows Rt to Rms, Rmd to Rb as in the above-described example illustrated in FIG. 7.

As illustrated in FIG. 8, the template TCEn can be arranged at the width-direction central region of the row Rt of the capacitance cell CDo. The template TCC can be arranged at the width-direction central region of the row Rms and the row Rmd of the capacitance cell CDo. This is as described above for FIG. 6.

The template TCEp can be arranged at the width-direction central region of the row Rb of the capacitance cell CDo.

The capacitance cell CDe can be assembled and designed by performing the above-described operations of FIGS. 7 and 8.

Figure 9:
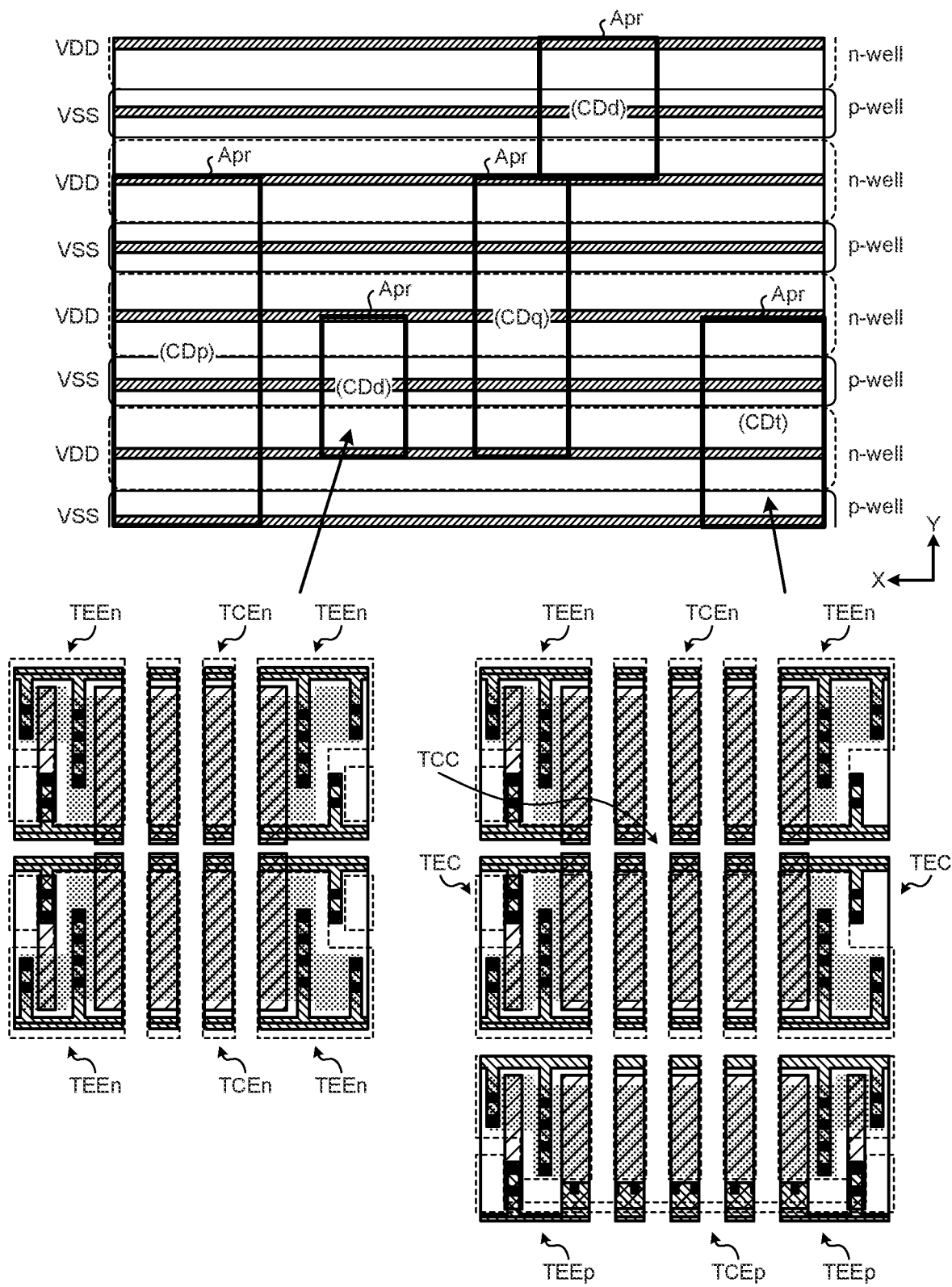
FIG. 9 is a schematic view illustrating an example case of assembling a capacitance cell according to the embodiment by using templates.

FIG. 9 is a schematic view illustrating an example case of assembling a capacitance cell CD according to the embodiment by using templates TEEn, TEC, TEEp, TCEn, TCC, and TCEp.

As illustrated in FIG. 9, for example, to form a capacitance cell CDd configured as a double-height cell, templates TEEn are appropriately arranged at four corners of the region Apr for the capacitance cell CDd. Templates TCEn, the number of which corresponds to the width of the region Apr for the capacitance cell CDd and is the same as each other, are arranged between each of the two sets of templates TEEn.

For example, to form a capacitance cell CDt configured as a triple-height cell, templates TEEn are appropriately arranged at two corners of the region Apr for the capacitance cell CDt on the power line VDD side. Templates TEC are arranged at the height-direction central portion and both width-direction end portions of the region Apr for the capacitance cell CDt. Templates TEEp are arranged at two corners on the power line VSS side of the region Apr for the capacitance cell CDt.

Templates TCEn, the number of which corresponds to the width of the region Apr for the capacitance cell CDt, are arranged between the templates TEEn at two corners on the power line VDD side. Templates TCC, the number of which corresponds to the width of the region Apr for the capacitance cell CDt and is the same as the number of templates TCEn arranged between the templates TEEn, are arranged between the templates TEC at the height-direction central portion and both width-direction end portions. Templates TCEp, the number of which corresponds to the width of the region Apr for the capacitance cell CDt and is the same as the number of templates TCEn and TCC arranged between the templates TEEn and between the templates TEC, respectively, are arranged between the templates TEEp at two corners on the power line VSS side.

Figure 10:
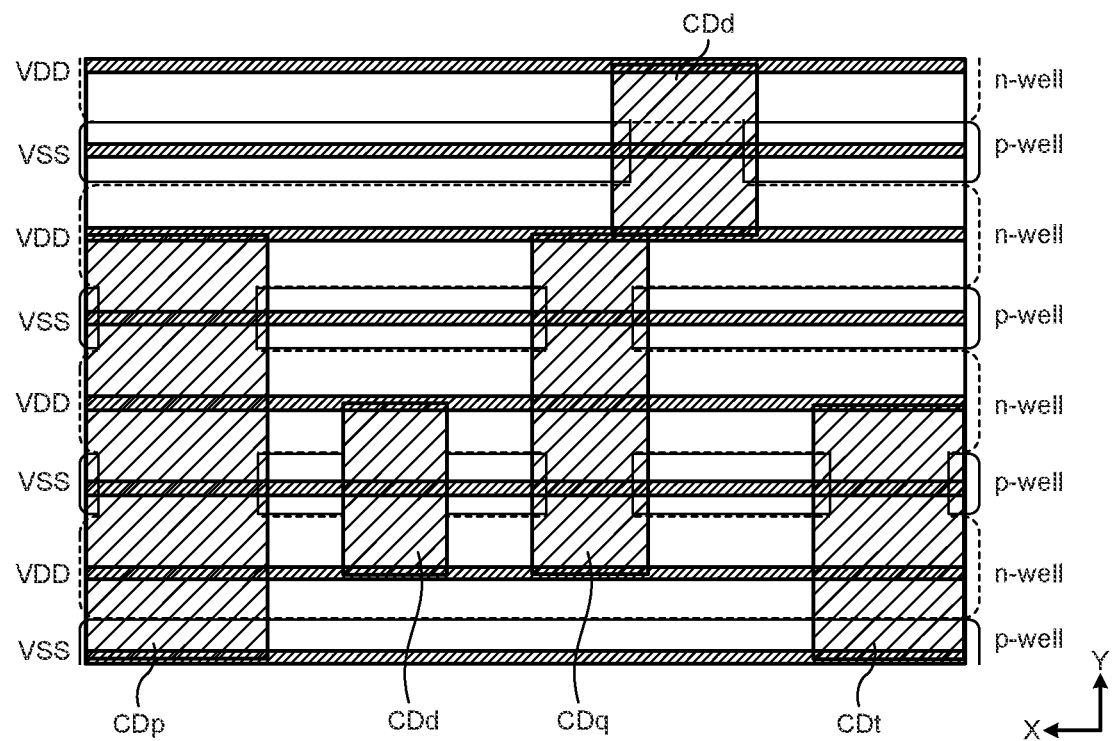
FIG. 10 is a schematic view illustrating an example layout of capacitance cells in the semiconductor device according to the embodiment.

These capacitance cells CDq and CDp can be assembled and designed by appropriately arranging templates TEEn, TEC, TEEp, TCEn, TCC, and TCEp in the regions Apr for the capacitance cells CDq and CDp in a similar procedure. FIG. 10 illustrates how the capacitance cells CDd, CDt, CDq, and CDp thus obtained are arranged in predetermined regions of the semiconductor device 1.

FIG. 10 is a schematic view illustrating an example layout of capacitance cells CDd, CDt, CDq, and CDp in the semiconductor device 1 according to the embodiment.

Thereafter, the entire layout of the semiconductor device 1 is obtained by appropriately arranging functional cells CS provided in the semiconductor device 1 in spaces between the capacitance cells CDd, CDt, CDq, and CDp.

In the semiconductor device 1 of the embodiment, each capacitance cell CD to be incorporated is configured as a multi-height cell having a cell height of two or more times the distance between the power lines VDD and VSS. Thus, as described above, it is preferable that the layout of the capacitance cells CD in the semiconductor device 1 is first determined and a chunk of regions in which the individual capacitance cells CD can be arranged is provided. In this manner, the semiconductor device 1 of the embodiment adopts a scheme in which capacitance cells CD are arranged as multi-height cells in a concentrated manner instead of being arranged as single-height cells independently of each other, for example.

However, instead of the above-described example, the layout of the functional cells CS in the semiconductor device 1 can be first determined and capacitance cells CD configured as multi-height cells can be arranged in a concentrated manner in vacant spaces.

Comparative Example

Figure 11A:
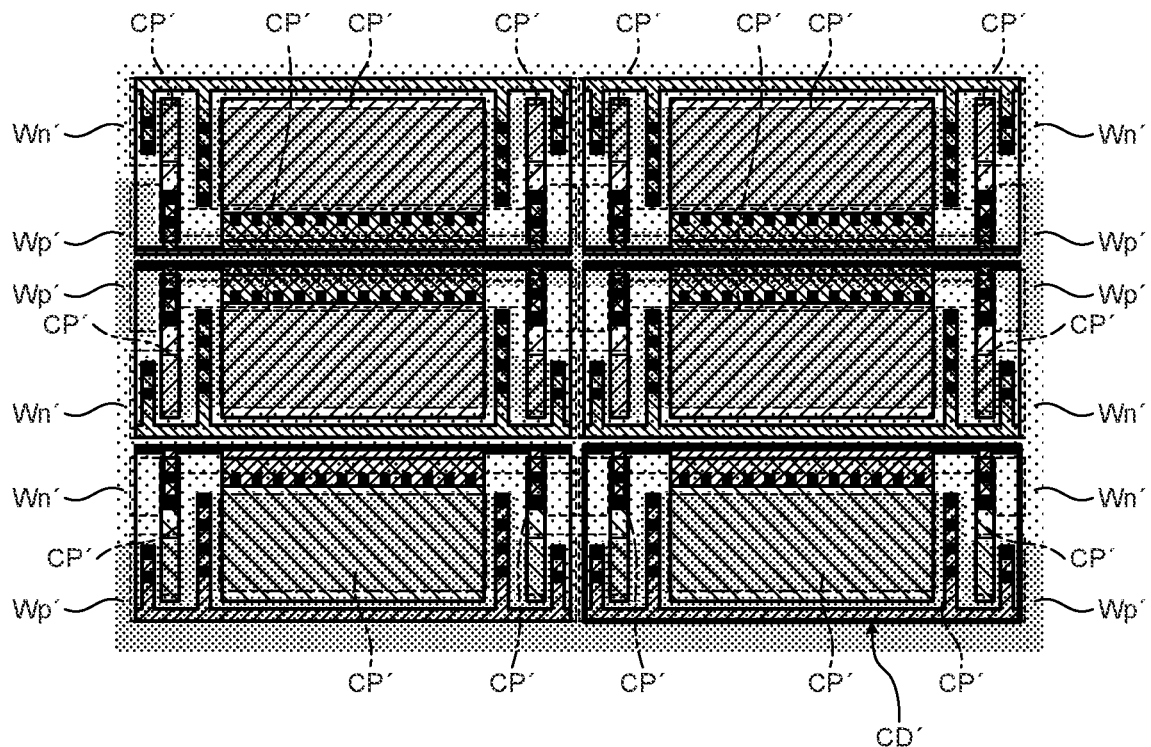
FIGS. 11A and 11B are plan views illustrating an example of capacitance cells according to the embodiment and capacitance cells according to a comparative example.
Figure 11B:
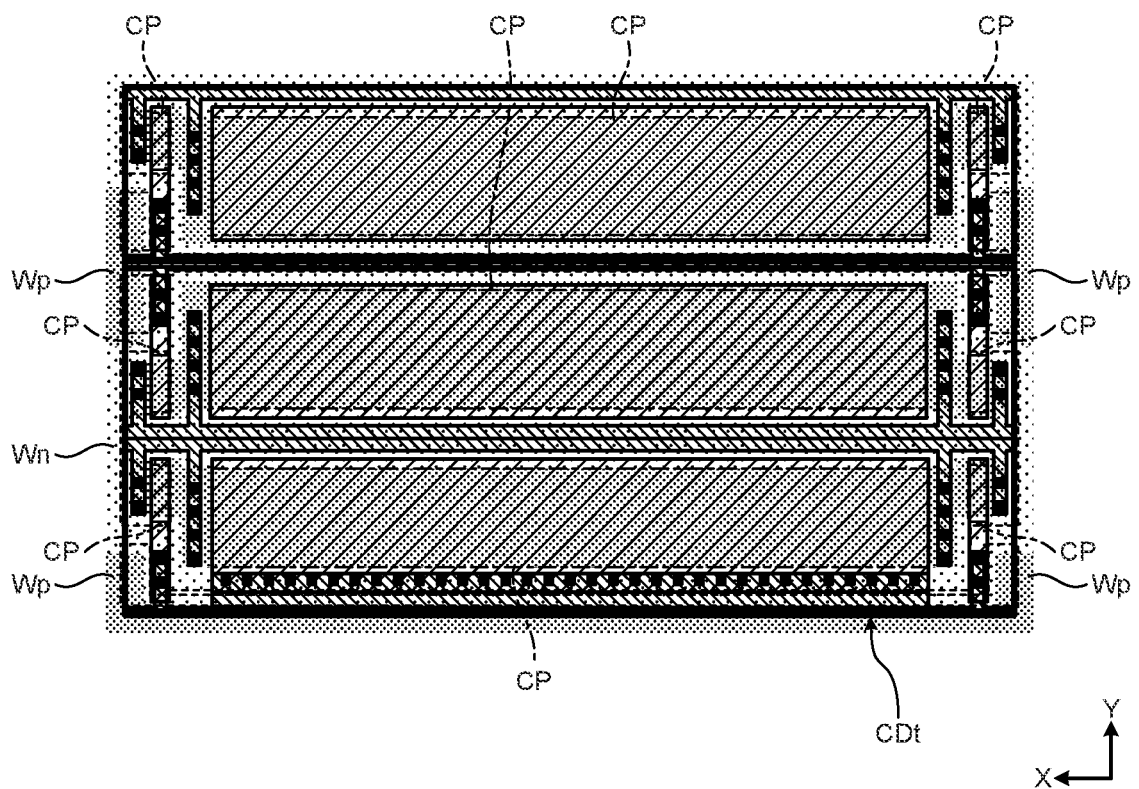

Next, capacitance cells CD' of a comparative example and capacitance cells CDt of the embodiment are compared by using FIGS. 11A and 11B. FIGS. 11A and 11B are plan views illustrating an example of capacitance cells CDt according to the embodiment and capacitance cells CD' according to the comparative example.

The capacitance cells CD' of the comparative example illustrated in FIG. 11A have a single cell structure, and a predetermined number of capacitance cells CD' are used in combination in correspondence with vacant spaces in the semiconductor device. More specifically, the capacitance cells CD' of the comparative example are configured as single-height cells, for example, and are configured as 20-grid cells, for example, with respect to a standard unit referred to as a grid and indicating the cell width.

A region indicated by a bold frame in FIG. 11A corresponds to one capacitance cell CD'. Therefore, the example of FIG. 11A illustrates how six capacitance cells CD' in total of vertically three columns by horizontally two columns are combined. As illustrated in FIG. 11A, the height-direction upper portion of one capacitance cell CD' is arranged in an n-well Wn', and its lower portion is arranged in a p-well Wp'.

In this manner, the capacitance cells CD' of the comparative example can adapt to various configurations of adjacent functional cells. In other words, the area of the n-well Wn' and the p-well Wp' of the capacitance cells CD' is determined by boundary constraints to be maintained with respect to adjacent functional cells.

However, when a plurality of capacitance cells CD' are arranged in a concentrated manner and used in combination, for example, a p-well Wp' is necessarily interposed at each portion between capacitance cells CD', and thus it is difficult to obtain a large continuous area of the diffusion region arranged in the n-well Wn' and the n-well Wn'. This also affects the area of a capacitance region CP' in which the gate electrode and the diffusion region overlap, and the ratio of the capacitance area of the capacitance cell CD' of the comparative example relative to the entire area of the capacitance cell CD' becomes 35%, for example.

For example, in a semiconductor device that performs high-speed processing such as a multi-core processor, an image processing device, and a microcomputer and a semiconductor device that handles a large amount of electric power, spaces for arrangement of capacitance cells for noise reduction are limited, and capacitance cells with higher capacitance efficiency are required.

On the other hand, capacitance cells CD of the embodiment are configured as multi-height cells, for example, and p-wells Wp interposed in the capacitance cells CD are eliminated as possible at least in the height direction.

The capacitance cell CDt of the embodiment illustrated in FIG. 11B is configured as a triple-height cell, and its cell width is the same as the cell width of the 20-grid cells included in the capacitance cells CD' of the comparative example described above. As illustrated in FIG. 11B, the capacitance cell CDt is arranged in one n-well Wn continuously extending in the height direction except for one height-direction end portion. Thus, a large area of the capacitance region CP in which the gate electrode and the diffusion region overlap can be obtained at least in the height direction, and the ratio of the capacitance area of the capacitance cell CDt of the embodiment relative to the entire area of the capacitance cell CDt can be increased to 62%, for example.

In the case of a capacitance cell CD having a cell height of an even multiple of the distance between the power lines VDD and VSS such as the above-described capacitance cells CDd and CDq, no p-well is interposed in the height direction at the width-direction central portion of the capacitance cell CD, and the ratio of the capacitance area is increased.

According to the semiconductor device 1 of the embodiment, the capacitance cell CD is configured as a multi-height cell, and the capacitance region CP of the gate electrodes GEc and GEe overlapping the diffusion region Dp is arranged in one continuous n-well Wn. In this manner, the ratio of the capacitance region CP per capacitance cell CD can be increased.

According to the semiconductor device 1 of the embodiment, when a capacitance cell CD has a cell height of an even multiple of the distance between the power lines VDD and VSS, both end portions of the capacitance cell CD in the height direction are arranged in one continuous n-well Wn. In this manner, the capacitance area of the capacitance cell CD can be further increased, and the capacitance efficiency can be further increased.

According to the semiconductor device 1 of the embodiment, when a capacitance cell CD has a cell height of an odd multiple of the distance between the power lines VDD and VSS, one end portion of the capacitance cell CD in the height direction is arranged in a p-well Wp. In this manner, the capacitance cell CD can adapt to various configurations of adjacent functional cells CS.

According to the semiconductor device 1 of the embodiment, each of both end portions of the capacitance cell CD in the width direction is arranged in a p-well Wp. In this manner, the capacitance cell CD can have a cell configuration that conforms to boundary constraints with respect to adjacent functional cells.

Note that although the semiconductor device 1 of the above-described embodiment includes capacitance cells CD using the gate electrode capacitance of PMOS transistors, the capacitance cells of the semiconductor device may be configured as NMOS transistors. In that case, the n and p conductivity types in the above-described configuration are changed as appropriate.

Variations

Next, configurations of semiconductor devices of variations of the embodiment will be described using FIGS. 12 to 14. In the variations, configurations of capacitance cells that can further increase the capacitance efficiency will be illustrated.

Figure 12:
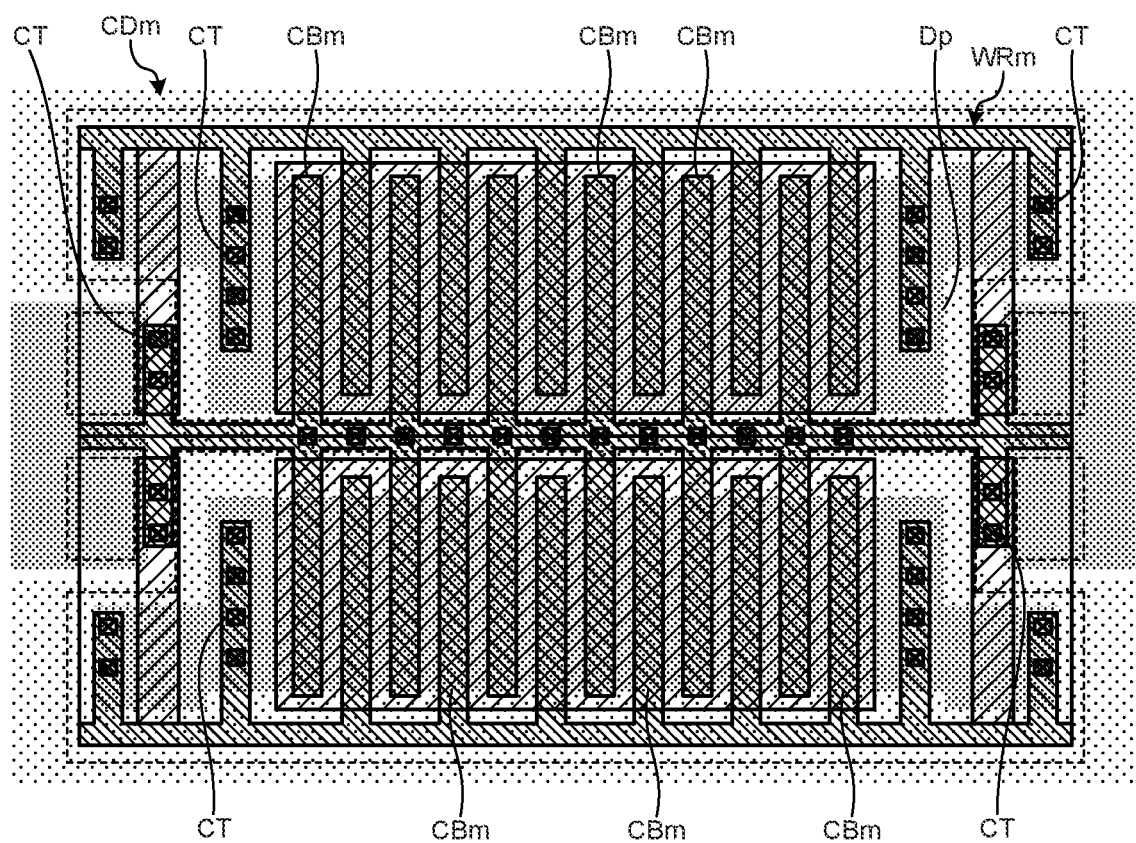
FIG. 12 is a plan view illustrating an example configuration of a capacitance cell according to a variation of the embodiment, the capacitance cell having a first wiring layer.

FIG. 12 is a plan view illustrating an example configuration of a capacitance cell CDm according to a variation of the embodiment, the capacitance cell CDm having a first wiring layer WRm. As illustrated in FIG. 12, the capacitance cell CDm of the variation includes components similar to those of the capacitance cell CDd of the above-described embodiment, and further includes the first wiring layer WRm mainly on a gate electrode. The first wiring layer WRm is connected to the diffusion region Dp or the gate electrode by the above-mentioned contact CT or the like.

The first wiring layer WRm includes a plurality of comb teeth CBm extending in the height direction, for example, and an insulation layer (not illustrated) is embedded at each portion between the comb teeth CBm. In this manner, a MOM (Metal-Oxide-Metal) capacitor using the inter-wiring capacitance of the comb teeth CBm intervened by the insulation layer can be formed. Therefore, in the capacitance cell CDm, the MOM capacitor is further provided in addition to the MOS capacitor using the gate electrode capacitance as described above, and the capacitance efficiency is further improved.

Figure 13:
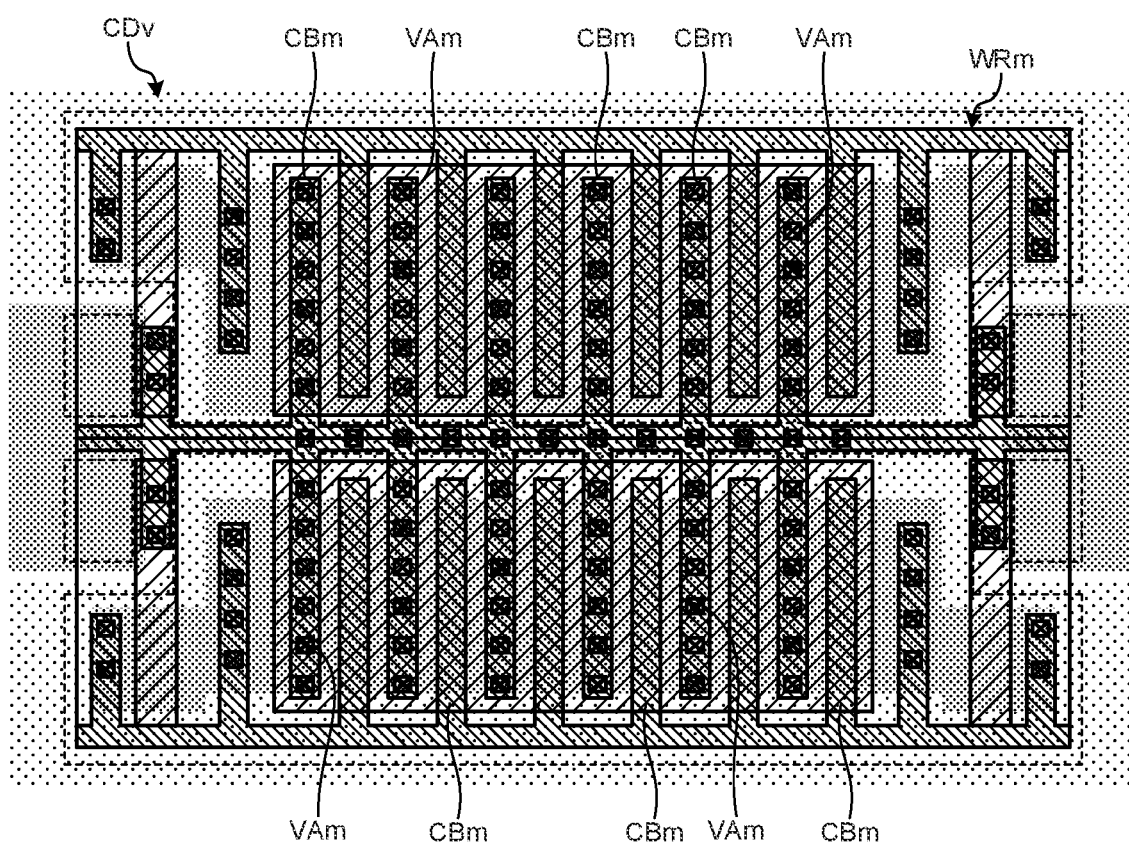
FIG. 13 is a plan view illustrating an example configuration of a capacitance cell according to a variation of the embodiment, the capacitance cell having vias formed on the first wiring layer for forming a second wiring layer.

FIG. 13 is a plan view illustrating an example configuration of a capacitance cell CDv according to a variation of the embodiment, the capacitance cell CDv having vias VAm formed on the first wiring layer WRm for forming a second wiring layer WRmm. As illustrated in FIG. 13, the capacitance cell CDv of the variation includes a plurality of vias VAm on the first wiring layer WRm of the capacitance cell CDm described above. Each of the plurality of vias VAm fills a through-hole provided in an insulation layer (not illustrated) and is connected to the first wiring layer WRm.

Figure 14:
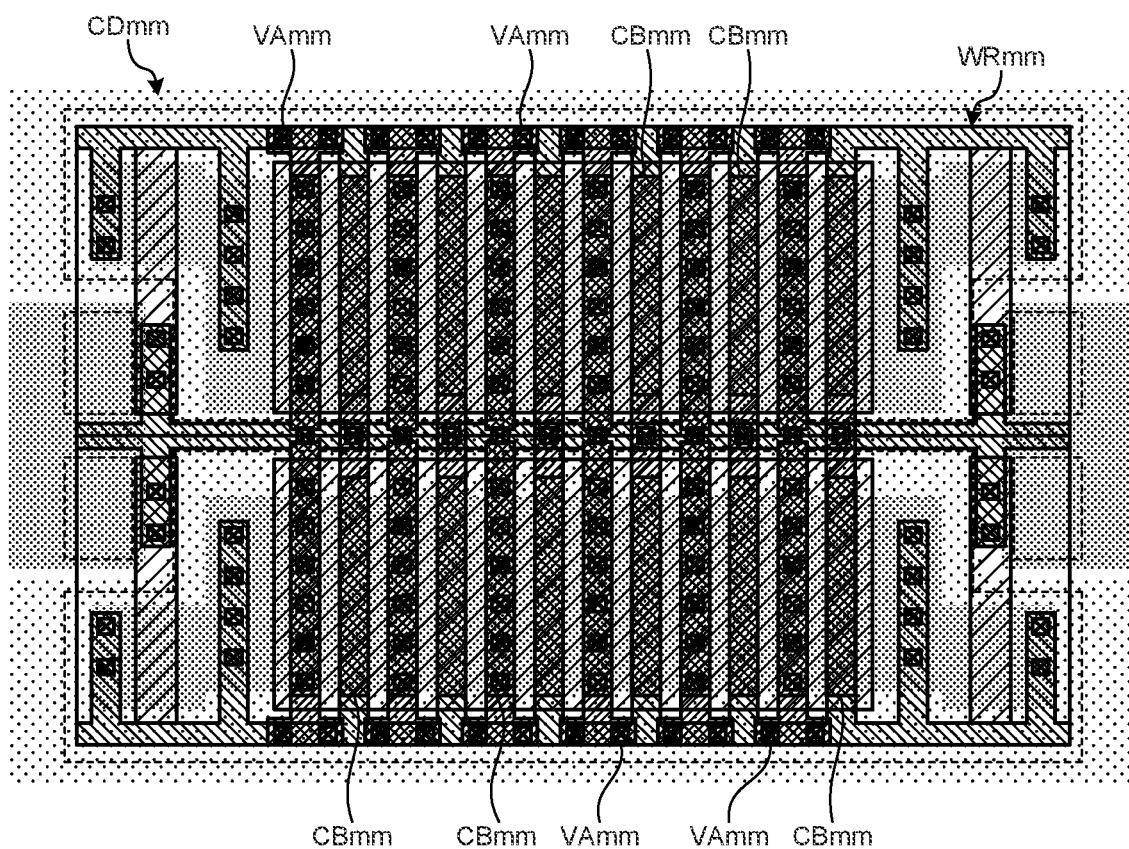
FIG. 14 is a plan view illustrating an example configuration of a capacitance cell according to a variation of the embodiment, the capacitance cell having a second wiring layer.

FIG. 14 is a plan view illustrating an example configuration of a capacitance cell CDmm according to a variation of the embodiment, the capacitance cell CDmm having a second wiring layer WRmm. As illustrated in FIG. 14, the capacitance cell CDmm of the variation includes the second wiring layer WRmm on the first wiring layer WRm of the capacitance cell CDm described above with the intervention of the plurality of vias VAm. Thus, the first wiring layer WRm and the second wiring layer WRmm are connected by the vias VAm.

The second wiring layer WRmm includes a plurality of comb teeth CBmm extending in the height direction, for example, and an insulation layer (not illustrated) is embedded at each portion between the comb teeth CBmm. In this manner, a MOM capacitor using the inter-wiring capacitance of the comb teeth CBmm intervened by the insulation layer can be formed. Therefore, in the capacitance cell CDmm, the MOM capacitor is further provided in addition to the MOS capacitor using the gate electrode capacitance as described above and the MOM capacitor of the first wiring layer WRm, and the capacitance efficiency is even further improved.

In addition, it can be considered that the capacitance efficiency of the capacitance cell CDmm is further increased in consideration of the via capacitance of the vias VAm connecting the first wiring layer WRm and the second wiring layer WRmm.

Note that the capacitance cell CDmm may further include vias VAmm or the like on the second wiring layer WRmm.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a plurality of power lines extending in a first direction; and
a plurality of cells arrayed along the first direction and a second direction intersecting the first direction and having a cell height of an integer multiple of a distance between the power lines adjacent to each other in the second direction, the cell height being a dimension in the second direction, wherein
the plurality of cells comprise:
a functional cell that contributes to a function of the semiconductor device; and
a capacitance cell comprising a diffusion region of a first conductivity type and a gate electrode stacked above the diffusion region, and functioning as a decoupling capacitor,
the capacitance cell is configured as a multi-height cell having a cell height of two or more times the distance,
the capacitance cell comprises a plurality of overlapping regions that are regions of the gate electrode overlapping the diffusion region in a stacking direction, the overlapping regions being aligned in the second direction, and
the plurality of overlapping regions are arranged in one continuous well of a second conductivity type different from the first conductivity type.

2. The semiconductor device according to claim 1, wherein
the capacitance cell has a cell height of an even multiple of the distance, and
both end portions of the capacitance cell in the second direction are arranged in the well.

3. The semiconductor device according to claim 2, wherein
the capacitance cell is designed by combining at least two types of templates:
a first template arranged in a region of the capacitance cell at an end portion in the first direction and at an end portion in the second direction; and
a second template arranged in a region of the capacitance cell at an inner side relative to the end portion in the first direction and at the end portion in the second direction.

4. The semiconductor device according to claim 3, wherein
the capacitance cell is designed to have a dimension in the first direction that is adjustable by adjusting a number of the second templates combined.

5. The semiconductor device according to claim 3, wherein
the capacitance cell has a cell height of four or more times the distance, and
the capacitance cell is designed by combining four types of templates:
the first template;
the second template;

a third template arranged in a region of the capacitance cell at the end portion in the first direction and at an inner side relative to the end portion in the second direction; and a fourth template arranged in a region of the capacitance cell at the inner side relative to the end portion in the first direction and at the inner side relative to the end portion in the second direction.

6. The semiconductor device according to claim 5, wherein
the capacitance cell is designed to have a dimension in the first direction that is adjustable by adjusting each of a number of the second templates combined and a number of the fourth templates combined.

7. The semiconductor device according to claim 1, wherein
the capacitance cell has a cell height of an odd multiple of the distance,
one end portion of the capacitance cell in the second direction is arranged in the well, and
another end portion of the capacitance cell in the second direction is arranged in a first well of the first conductivity type.

8. The semiconductor device according to claim 7, wherein
the capacitance cell has a cell height of three or more times the distance, and
the capacitance cell is designed by combining six types of templates:
a first template arranged in a region of the capacitance cell at an end portion in the first direction and at one end portion in the second direction;
a second template arranged in a region of the capacitance cell at an inner side relative to the end portion in the first direction and at the one end portion in the second direction;
a third template arranged in a region of the capacitance cell at the end portion in the first direction and at an inner side relative to the end portion in the second direction;
a fourth template arranged in a region of the capacitance cell at the inner side relative to the end portion in the first direction and at the inner side relative to the end portion in the second direction;
a fifth template arranged in a region of the capacitance cell at the end portion in the first direction and another end portion in the second direction; and
a sixth template arranged in a region of the capacitance cell at the inner side relative to the end portion in the first direction and at the another end portion in the second direction.

9. The semiconductor device according to claim 8, wherein
the capacitance cell is designed to have a dimension in the first direction that is adjustable by adjusting each of a number of the second templates combined, a number of the fourth templates combined, and a number of the sixth templates combined.

10. The semiconductor device according to claim 8, wherein
the capacitance cell has a cell height of five or more times the distance, and
the capacitance cell is designed by combining the six types of templates:

the first template;
the second template;
the third template;
the fourth template;
the fifth template; and
the sixth template.

11. The semiconductor device according to claim 10, wherein
the capacitance cell is designed to have a dimension in the first direction that is adjustable by adjusting each of a number of the second templates combined, a number of the fourth templates combined, and a number of the sixth templates combined.

12. The semiconductor device according to claim 1, wherein
the capacitance cell comprises:
a first region arranged in a second well of the first conductivity type on one end portion side in the first direction; and
a second region arranged in a third well of the first conductivity type on another end portion side in the first direction.

13. The semiconductor device according to claim 12, wherein
the functional cell comprises:
a third region arranged in the well of the second conductivity type; and
a fourth region arranged in the second well of the first conductivity type and aligned with the third region in the second direction, and
the second well is continuously arranged in the first direction from the first region or the second region of the capacitance cell to the fourth region of the functional cell.

14. The semiconductor device according to claim 13, wherein
the functional cell comprises a first functional cell and a second functional cell adjacent to the first functional cell in the second direction,
the first functional cell comprises:
the third region on one end portion side in the second direction; and
the fourth region on another end portion side in the second direction, and
the second functional cell comprises:
the fourth region on the one end portion side in the second direction; and
the third region on the another end portion side in the second direction.

15. The semiconductor device according to claim 1, further comprising:
a wiring layer arranged at a level above the gate electrode and electrically connected to at least one of the gate electrode and the diffusion region.

16. The semiconductor device according to claim 15, wherein
the wiring layer has a comb teeth-like structure.

17. The semiconductor device according to claim 15, wherein
the wiring layer comprises a plurality of wiring layers at respective different levels, and
the plurality of wiring layers are connected to each other by a via.

* * * * *